(12) United States Patent
Koike et al.

(10) Patent No.: US 12,356,542 B2
(45) Date of Patent: Jul. 8, 2025

(54) WIRING BOARD AND METHOD FOR MANUFACTURING SAME

(71) Applicant: MATERIAL CONCEPT, INC., Sendai (JP)

(72) Inventors: Junichi Koike, Sendai (JP); Tri Hai Hoang, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 225 days.

(21) Appl. No.: 17/789,353

(22) PCT Filed: Dec. 24, 2020

(86) PCT No.: PCT/JP2020/048490
§ 371 (c)(1),
(2) Date: Jun. 27, 2022

(87) PCT Pub. No.: WO2021/132479
PCT Pub. Date: Jul. 1, 2021

(65) Prior Publication Data
US 2023/0056971 A1   Feb. 23, 2023

(30) Foreign Application Priority Data

Dec. 27, 2019   (JP) ................ 2019-239765

(51) Int. Cl.
*H05K 1/02* (2006.01)
*H05K 1/03* (2006.01)
(Continued)

(52) U.S. Cl.
CPC ......... *H05K 1/0277* (2013.01); *H05K 1/0313* (2013.01); *H05K 1/092* (2013.01); *H05K 3/1283* (2013.01); *H05K 2203/1131* (2013.01)

(58) Field of Classification Search
CPC ....... H05K 1/097; H05K 1/095; H05K 3/1283
See application file for complete search history.

(56) References Cited

U.S. PATENT DOCUMENTS

2005/0252398 A1\* 11/2005 Ohkura ................ H01L 21/565
257/E23.06
2016/0351529 A1\* 12/2016 Brunschwiler ......... H01L 24/08
2017/0349773 A1   12/2017 Bollen

FOREIGN PATENT DOCUMENTS

CN       1697588 A    11/2005
JP     S62072200 A     4/1987
(Continued)

OTHER PUBLICATIONS

Machine translation of JP 2015/211092 (2015).\*
(Continued)

*Primary Examiner* — Jeremy C Norris
(74) *Attorney, Agent, or Firm* — CANTOR COLBURN LLP

(57) ABSTRACT

Provided are: a novel wiring board having flexibility derived from a resin board and the high electrical conductivity derived from a metal wiring as well as high adhesion between the metal wiring and the insulating resin board; and a method for manufacturing the wiring board without using a photolithography process. A wiring board according to the present invention comprises a resin board and a metal wiring, the metal wiring including a sintered body of metal particles, the sintered body including a plurality of voids having opening portions extending toward the resin board, parts of the resin board entering the voids from the opening portions.

10 Claims, 4 Drawing Sheets

(51) Int. Cl.
    *H05K 1/09*    (2006.01)
    *H05K 3/12*    (2006.01)

(56)         References Cited

FOREIGN PATENT DOCUMENTS

| JP | H05136547 A |   | 6/1993  |        |            |
|----|-------------|---|---------|--------|------------|
| JP | 2004281658 A |  | 10/2004 |        |            |
| JP | 2005322834 A |  | 11/2005 |        |            |
| JP | 2015211092 A | * | 11/2015 | ....... | H01L 2924/181 |
| JP | 2016110690 A |  | 6/2016  |        |            |
| TW | 201640521 A |   | 11/2016 |        |            |
| TW | 201927543 A |   | 7/2019  |        |            |

OTHER PUBLICATIONS

CNIPA Notice of First Examination Opinion for corresponding CN Application No. 202080090347.3; Mailing Date, Aug. 31, 2023.
Cao et al., "Ni—Cr selective surface based on polyamide substrate", Elsevier; Thin Solid Films, vol. 365(1), Apr. 3, 2000, pp. 49-52.
International Search Report for International Application No. PCT/JP2020/048490; Mailing date: Mar. 30, 2021.
TIPO Office Action for corresponding TW Application No. 11021137380; Issued Nov. 19, 2021.

* cited by examiner

WIRING BOARD AND METHOD FOR MANUFACTURING SAME

CROSS REFERENCE TO RELATED APPLICATIONS

This is the U.S. national stage of application No. PCT/JP2020/048490, filed on Dec. 24, 2020. Priority under 35 U.S.C. § 119 (a) and 35 U.S.C. § 365 (b) is claimed from Japanese Application No. 2019-239765, filed Dec. 27, 2019, the disclosure of which is also incorporated herein by reference.

TECHNICAL FIELD

The present invention relates to a wiring board and a method for manufacturing such a wiring board.

BACKGROUND ART

A flexible wiring board uses a flexible organic insulating film as a board, and a metal wiring is formed on this insulating film.

As a method of forming a metal wiring on a board, there are three types of methods: a subtractive method, a semi-additive method, and an additive method.

Specifically, in the subtractive method, metal foil is attached to a board, and wiring is formed by a photolithography process. In the semi-additive method, a thin film which serves as a seed layer is deposited on a board by sputtering or the like, and thereafter electrolytic plating is performed to form wiring (see, for example, Patent Documents 1 and 2). However, the subtractive method and the semi-additive method each require the photolithography process, and thus numerous steps are necessary. In addition, for example, waste liquid treatment is required, and thus costs and environmental load are increased.

On the other hand, the additive method is a method of using inkjet or screen printing to directly draw a metal wiring on a board and thereby forming the metal wiring, and it is advantageous in that the photolithography process is not required. Disadvantageously, however, the metal wiring is only directly formed on the board, and thus adhesion strength between the metal wiring and the board is low, with the result that the metal wiring is easily separated. Hence, a method (see, for example, Non-Patent Document 1) is known in which a Ni—Cr alloy thin film is previously formed on a board as an adhesion layer and thereafter the metal wiring is formed, in order to increase adhesion strength between the metal wiring and the board. However, in such a method, etching is performed to form the Ni—Cr alloy thin film serving as the adhesion layer into a wiring shape, and thus the photolithography process is required. Therefore, even in the method in which the adhesion layer is formed, as in the subtractive method and the semi-additive method, numerous steps and waste liquid treatment are required, with the result that costs and environmental load are disadvantageously increased.

Patent Document 1: Japanese Unexamined Patent Application, Publication No. S62-72200

Patent Document 2: Japanese Unexamined Patent Application, Publication No. H5-136547

Non-Patent Document 1: Y. Cao, J. Tian, and X. Hu, Thin Solid Films, Vol. 365(1), pp. 49-52 (2000)

DISCLOSURE OF THE INVENTION

Problems to be Solved by the Invention

The present invention is made in view of the circumstance as described above, and an object thereof is to provide a wiring board which has both the flexibility derived from a resin board and the high electrical conductivity derived from a metal wiring as well as high adhesion between the metal wiring and the insulating resin board, and to provide a method for manufacturing the wiring board as described above without use of the photolithography process.

Means for Solving the Problems

In order to solve the problems described above, the present inventor et al. have conducted a thorough study. Consequently, they have found that, in a wiring board including a resin board and a sintered body of metal particles, the sintered body includes a plurality of voids, parts of the resin board enter from the opening portions of the voids making it possible to obtain a wiring board having an intended function, and that the wiring board as described above can be manufactured by forming the sintered body of the metal particles and the resin board, with the result that the present invention has been completed. Specifically, the present invention provides the following embodiments.

(1) A wiring board including a resin board and a metal wiring, the metal wiring including a sintered body of metal particles, the sintered body including a plurality of voids having opening portions extending toward the resin board, parts of the resin board entering the voids from the opening portions.

(2) The wiring board as described in (1) above, in which the metal particles include one or more types selected from the group consisting of copper, silver, and nickel.

(3) The wiring board as described in (1) or (2) above, having a void proportion of 1% by volume or more and 30% by volume or less.

(4) The wiring board as described in any one of (1) to (3) above, in which parts of the voids are connected to each other and parts of the resin board having entered the voids from the opening portions are connected to each other.

(5) The wiring board as described in any one of (1) to (4) above, in which a resin surface layer is formed on a surface of the sintered body, the surface being located on a side opposite to a boundary interface in contact with the resin board.

(6) A method for manufacturing a wiring board including a resin board and a metal wiring containing a sintered body of metal particles, the method including: forming the sintered body on a sintering member; applying, on the sintering member, a solution including a resin component to a surface of the sintered body and around the sintered body; curing the resin component to form the resin board; and separating the sintered body and the resin board from the sintering member.

(7) The method for manufacturing a wiring board as described in (6) above, in which the solution includes a precursor substance for the resin or a polymerizable monomer of the resin.

(8) A method for manufacturing a wiring board including a resin board and a metal wiring containing a sintered body of metal particles, the method including: providing the resin board; and forming the sintered body on the resin board.

(9) The method for manufacturing a wiring board as described in (8) above, the method including: applying a solution including a resin component on the resin board and curing the resin component to form an interface resin layer, in which the forming the sintered body includes forming the sintered body on the interface resin layer.

(10) The method for manufacturing a wiring board as described in (9) above, in which the solution includes a precursor substance of a resin or a polymerizable monomer of a resin.

Effects of the Invention

According to the present invention, it is possible to provide a wiring board which has both the flexibility derived from a resin board and the high electrical conductivity derived from a metal wiring, and also has high adhesion between the metal wiring and the insulating resin board. By a method for manufacturing a wiring board according to the present invention, it is possible to manufacture such a wiring board without use of the photolithography process.

BRIEF DESCRIPTION OF THE DRAWINGS

FIG. 2A and FIG. 2B show a sintered body formation step; FIG. 2C shows a resin application step; FIG. 2D shows a resin curing step; and FIG. 2E shows a separation step.

PREFERRED MODE FOR CARRYING OUT THE INVENTION

A specific embodiment of the present invention will be described in detail below. The present invention is not at all limited to the embodiment described below, and an embodiment obtained by adding a modification as necessary can be performed within the range of the object of the present invention.

1. Wiring Board

Figure 1:
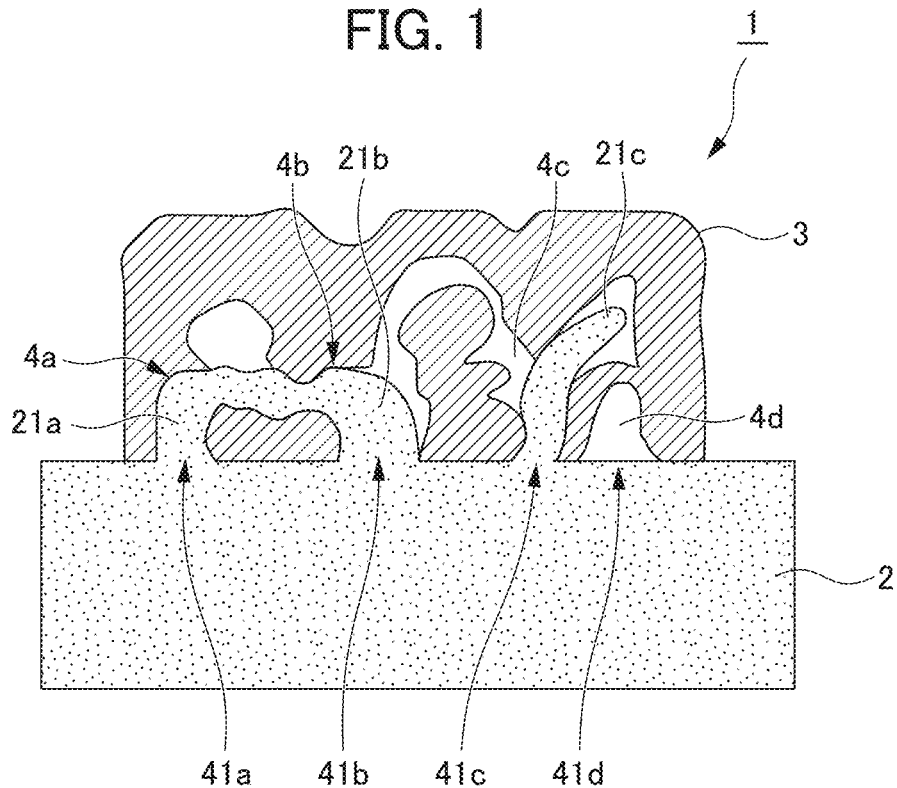
FIG. 1 is a schematic view showing a cross section of a wiring board according to the present embodiment.

A wiring board according to the present embodiment will be described in detail below with reference to FIG. 1. FIG. 1 is a vertical cross-sectional view of part of the wiring board according to the present embodiment which includes a sintered body.

The wiring board 1 according to the present embodiment is a wiring board which includes a resin board 2 and a metal wiring, and the metal wiring includes the sintered body 3 of metal particles. The sintered body 3 includes a plurality of voids 4a, 4b, 4c, and 4d. In the present specification, the voids 4a, 4b, 4c, and 4d may be collectively referred to as the voids 4. The voids 4 have, in at least part thereof, opening portions 41a, 41b, 41c, and 41d extending toward the resin board 2, and parts 21a, 21b, and 21c of the resin board 2 enter the voids 4 from the opening portions 41a, 41b, and 41c. As shown in FIG. 1, the parts 21a, 21b, and 21c of the resin board bend to enter the voids 4a, 4b, and 4c. The form as described above is provided, and thus a contact portion of the insulating resin board and the sintered body is increased in contact area. Furthermore, when the sintered body is separated from the resin board, the resin entering the voids needs to deform, and thus the separation of the sintered body from the resin board is suppressed. Hence, the structure of the present embodiment is provided, and thus it is possible to enhance adhesion between the sintered body and the resin board.

The parts 21a and 21b of the resin board 2 entering from the opening portions 41a and 41b are preferably connected to each other in the voids 4. The connected structure as described above is provided, and thus the contact portion of the sintered body and the resin board is increased in contact area. Furthermore, when the sintered body is separated from the resin board, the parts of the resin board connected in the voids need to be disconnected, and thus the separation of the sintered body from the resin board is suppressed. Hence, the structure of the present embodiment is provided, and thus it is possible to enhance adhesion between the sintered body and the resin board.

The wiring board according to the present embodiment may include a form in which an interface resin layer is interposed between the resin board and the sintered body.

[Porosity]

In the sintered body, the proportion of the voids in total is preferably 1% by volume or more and 30% by volume or less. In the present specification, the proportion of the voids is referred to as a "porosity". When the porosity is 1% by volume or more, the sintered body has the opening portions from which parts of the resin board can enter the voids. The proportion of the voids having the opening portions extending toward the resin board is increased, and thus the parts of the resin board easily enter the voids, with the result that it is possible to enhance adhesion between the resin board and the sintered body. Hence, the porosity is preferably 1% by volume or more, further preferably 7% by volume or more and still further preferably 10% by volume or more.

On the other hand, when the porosity exceeds 30% by volume, the sintered body may be broken, and thus the electrical conductivity of the sintered body may be reduced. In terms of enhancing the breaking resistance and electrical conductivity of the sintered body, the porosity is preferably 30% by volume or less, further preferably 27% by volume or less and still further preferably 25% by volume or less.

The "porosity" which is the proportion of the voids in the present embodiment is assumed to be calculated as follows. Specifically, a cross section of the sintered body is observed with a scanning electron microscope, and thus the area of an interior which is bordered with the periphery of the cross section is obtained as a "total cross-sectional area", and the area of the voids distributed in the interior is obtained as a "void area". Values given by formula (1) below for 10 cross sections are averaged, and the resulting value is the porosity.

$$\text{porosity (\%)} = (\text{void area}/\text{total cross-sectional area}) \times 100 \quad \text{formula (1)}$$

The porosity in the present embodiment is assumed to be calculated on the condition that in an image observed with the scanning electron microscope, a region excluding ends of the sintered body (boundaries between the surface of the sintered body and the resin board) is selected and the image area of the selected region falls in a range of one third to two thirds of the total cross-sectional area of the sintered body.

[Resin Board]

The resin board 2 is a board which mainly includes a resin and is intended to form the sintered body 3 of metal particles on the resin board 2 so as to form the wiring board 1.

The resin composition of the resin board is not particularly limited. A flexible resin such as a polyimide, liquid crystal polymer, fluororesin, polyethylene terephthalate or polyethylene naphthalate can be used.

The resin board can include, according to the application of the wiring board, an antioxidant, a flame retardant, a filler formed of inorganic particles or the like in addition to the resin.

The thickness of the resin board is not particularly limited. For example, when the thickness of the resin board is 5 μm or more, the board can be prevented from being broken by bending or tensile deformation. Hence, the thickness of the resin board is preferably 5 μm or more, and further preferably 10 μm or more or 15 μm or more. On the other hand, when the thickness of the resin board is excessive, the flexibility derived from the resin material is reduced. Hence, the thickness of the resin board is preferably 100 μm or less, and further preferably 75 μm or less or 50 μm or less.

The resin board in the present embodiment includes a form in which an interface resin layer is provided in a boundary interface in contact with the sintered body.

[Sintered Body]

The sintered body in the wiring board according to the present embodiment is formed with metal particles including one or more types selected from the group consisting of copper, silver, and nickel, and the sintered body functions as the metal wiring which serves as an electrical conductive path in the wiring board.

Copper is used as the metal particles in the sintered body, and thus it is possible to provide the metal wiring exhibiting low electrical resistance at low cost. Silver is used as the metal particles, and thus wiring is not oxidized even when high-temperature sintering is performed. Furthermore, nickel is used as the metal particles, and thus it is possible to reduce an electromigration failure which occurs in the state of a high current density load.

The metal particles may be formed with a plurality of metal particles selected from the group consisting of copper, silver, and nickel. In this case, part or the whole of the sintered body may be alloyed.

When the voids are included within the sintered body, there exists a part where the mechanical strength thereof is low. Examples of such a part includes a part called a "neck" in which a portion where the metal particles are sintered is thinly formed. A flexible resin board is selected as the wiring board, and thus when the wiring board is deformed according to deformation in an application in which the wiring board can be used as a flexible circuit, a stress is concentrated on the neck, with the result that localized destruction easily occurs.

Hence, when the sintered body has a porous structure, an electrical conductive metal element is preferably included in the gaps of the porous structure, and in particular, the plating of the same metal element as the metal element of the sintered body is preferably included. The metal element is preferably one or more types selected from the group consisting of copper, silver, tin, and nickel. Due to the presence of the metal plating as described above, the stress concentrated on the neck at the time of deformation can be dispersed, and thus durability against deformation such as bending or stretching is enhanced. Furthermore, since the voids are filled with the conductive metal element, the electrical resistivity of the sintered body is reduced.

Depending on the type of metal element of the sintered body and the environment in which the wiring board is placed, the metal element in the sintered body may inevitably be oxidized. Hence, as long as conductivity is guaranteed, up to 20% or less of metal atoms in terms of the number of atoms may be oxidized in the sintered body. The sintered body may include about 30% by mass of various additives and inevitable impurities other than copper, silver, tin, and nickel with respect to the sintered body (100% by mass). The inevitable impurities include oxygen element in an oxide.

[Resin Surface Layer]

The wiring board according to the present embodiment preferably has a form in which a resin surface layer is included in a surface of the sintered body located on a side opposite to a boundary interface in contact with the resin board. In the present specification, a resin layer formed on the surface of the sintered body is referred to as the "resin surface layer". In the sintered body, a plurality of voids is distributed with a porosity equal to or greater than a certain level. Hence, in the process of manufacturing the wiring board according to the present embodiment on a sintering member, the resin of the resin board passes through the voids connected within the sintered body and spreads by wetting to an interface between the sintered body and the sintering member. Consequently, the resin surface layer is formed on the surface of the sintered body located on the side opposite to the boundary interface in contact with the resin board. Preferably, when the wiring board including such a resin surface layer is used under an environment in which the wiring board is heated in the atmosphere, since the surface of the sintered body is coated with the resin surface layer, the oxidization of the surface is suppressed, and satisfactory durability is shown.

2. Method for Manufacturing Wiring Board (1) Embodiment Example 1 of Manufacturing Method A method for manufacturing a wiring board according to the present embodiment is a method for manufacturing a wiring board including a resin board and a metal wiring containing a sintered body of metal particles, and the method includes: a sintered body formation step of forming the sintered body on a sintering member: an application step of applying, on the sintering member, a solution including a resin component to the surface of the sintered body and around the sintered body; a resin layer formation step of curing the resin component to form a resin layer; and a separation step of separating the sintered body and the resin layer from the sintering member.

(2) Embodiment Example 2 of Manufacturing Method

Another method for manufacturing a wiring board according to the present embodiment is a method for manufacturing a wiring board including a resin board and a metal wiring containing a sintered body of metal particles, and the method may include: a step of preparing the resin board; a step of applying a solution including a resin component on the resin board; a cure step of curing the resin component to form a resin interface layer; and a sintering step of forming the sintered body on the resin interface layer.

A resin board which is produced beforehand in a film shape, a plate shape, or the like is prepared, a metal-containing paste is applied on the resin board and the sintered body of metal particles can be produced through a drying step and a firing step. Here, the firing temperature of the metal-containing paste is a temperature at which the resin board can be prevented from being degraded by heat, and for example, for a polyimide board, the temperature needs to be approximately 450° C. or less.

A manufacturing method may be adopted which includes a step of applying a solution including a resin component on the resin board and curing the resin component to form an interface resin layer, and in which the sintering step includes forming the sintered body on the interface resin layer. In order to enhance adhesion between the resin board and the sintered body, a resin precursor or a resin solution is applied on the resin board, and the interface resin layer is formed through a predetermined heat treatment step. Thereafter, the metal-containing paste may be applied on the interface resin layer to produce the sintered body of metal particles through a drying step and a firing step. As the resin precursor, for example, polyamic acid can be used. As the resin solution, for example, polyimide varnish can be used.

According to the method for manufacturing a wiring board such as "(1) Embodiment example 1 of manufacturing method" or "(2) Embodiment example 2 of manufacturing method" mentioned above, the wiring board having the features described in "1. Wiring board" mentioned above is obtained. Specifically, the wiring board is obtained which includes: a resin board; and a metal wiring, and in which the metal wiring includes a sintered body of metal particles, the sintered body includes a plurality of voids having opening portions extending toward the resin board, and parts of the resin board enter the voids from the opening portions.

The method for manufacturing the wiring board according to the present embodiment will be described below with reference to FIG. 2A to FIG. 2E. FIG. 2A to FIG. 2E are schematic views for illustrating the manufacturing method. The description will be given based on "Embodiment example 1 of manufacturing method" mentioned above. The manufacturing method according to the present invention is not limited to Embodiment example 1. By "Embodiment example 2 of manufacturing method" mentioned above, it is also possible to provide the wiring board having the features of the present invention.

[Sintered Body Formation Step]

Figure 2A:
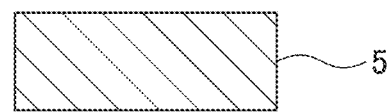
FIG. 2A to FIG. 2E are schematic views for illustrating a method for manufacturing a wiring board according to the present embodiment.
Figure 2B:
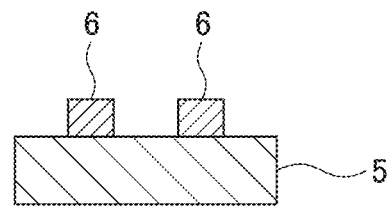

The sintered body formation step in the present embodiment is shown in FIGS. 2A and 2B. The sintered body formation step is a step of forming the sintered body 6 of metal particles on the sintering member 5. As the metal particles, one or more types selected from the group consisting of copper, silver, and nickel are preferably included.

An example of a method of forming the sintered body 6 on the sintering member 5 will be described below. The manufacturing method according to the present invention is not limited to a specific example below. As long as the effects of the present invention are not impaired, any known or unknown example can be adopted.

(Sintering Member)

As the sintering member, a sintering member is preferably selected which bonds, to some extent, the metal-containing paste including the metal particles applied on the sintering member, the dried product thereof and the sintered body formed by sintering it, and which is not easily separated in the subsequent steps.

The type of material of the sintering member is preferably a material which does not react with metal when the metal-containing paste is sintered at high temperature. For example, an inorganic board including an inorganic material can be used, and any one of a carbide board, a nitride board and an oxide board can be used. Specific examples of the inorganic material include silicon carbide (SiC), silicon nitride (Si3N4), boron nitride (BN), silicate glass (SiO2), magnesia (MgO), alumina (Al2O3), murite (Al2O3+SiO2), silicon (Si), and the like. A metal such as molybdenum or tungsten which can be molded into a sheet shape and does not react with metal in the paste can be used. Since separation when the wiring board of the sintered body and the resin board is separated from the sintering member is satisfactory, magnesia (MgO) or silicate glass (SiO2) is preferably used as the material.

As the sintering member, a graphite board may be used. When a graphite board is used as the sintering member, graphite particles may be adhered on the resin layer in the wiring board, and thus depending on the application of the wiring board, the function (for example, electrical insulation) of the resin layer may be impaired. In such a case, the surface of the sintering member is coated with an insulator such as carbide, nitride, or oxide, and thus the sintering member can be used.

As shown in this example, for the sintering member, with consideration given to the adhesion of the metal-containing paste, the dried product thereof and the sintered body and the application of the wiring board obtained, the surface of the sintering member may be modified or coated. For the modification or coating, either of organic and inorganic modifications or coatings may be adopted.

The average roughness (Ra) of the surface of the sintering member is preferably 25 μm or less. The average roughness (Ra) is 25 μm or less, and thus the smoothness of the surface of the resin layer formed on the surface of the sintering member is guaranteed, with the result that it is possible to prevent the generation of a starting point which breaks the resin layer due to tensile or bending deformation.

(Metal-Containing Paste)

The metal-containing paste is used for forming the sintered body of metal including one or more types selected from the group consisting of copper, silver, and nickel. Specifically, the metal-containing paste includes, for example, at least metal particles or metal oxide particles, a binder resin and a solvent.

(Metal Particles or Metal Oxide Particles)

The metal particles may include a metal element other than copper, silver, and nickel. The content of the metal element other than copper, silver, and nickel is preferably 30% by mass or less and may be 20% by mass or less, with respect to all metal elements included in the metal sintered body, regardless of its state, in terms of metal.

The content of a glass component such as glass frit in the metal-containing paste is not particularly limited. The content of the glass component in the metal-containing paste is preferably 5% by mass or less and further preferably 1% by mass or less, 0.5% by mass or less or 0.1% by mass or less, with respect to all metal elements included in the metal-containing paste, regardless of its state, in terms of metal. When the content of the glass component in the metal-containing paste exceeds 5% by mass, in the sintering step of using the metal-containing paste to form the sintered body, the glass component and the sintering member excessively react with each other. Hence, when the resin layer is peeled off from the sintering member, the sintered body may be left on the surface of the sintering member, and thus it is not desirable that the content of the glass component in the metal-containing paste exceeds 5% by mass. The content of the glass component is 0.5% by mass or less or 0.1% by mass or less, and thus it is possible to reduce an increase in the electrical resistivity of the sintered body.

The average particle diameter (D50) of the metal particles or the metal oxide particles is not particularly limited. The average particle diameter (D50) is preferably 0.1 µm or more and 20 µm or less. When the average particle diameter (D50) is 0.1 µm or more, it is possible to prevent the occurrence of wiring fracture owing to the surface roughness of the sintering member 5, so that the wiring function is impaired. It is also possible to prevent the size reduction of the void opening portion to a small size equivalent to the particle diameter, so that the parts of the resin board becomes difficult to enter the void opening portion. The average particle diameter (D50) is 20 µm or less, and thus the bent portions of the voids can be formed. The average particle diameter (D50) of the metal particles or the metal oxide particles in the present embodiment refers to the particle diameter with respect to 50% by volume and refers to the particle diameter measured by laser diffraction.

The content of the metal particles or the metal oxide particles is not particularly limited. For example, the content of the metal particles or the metal oxide particles is preferably 80% by mass or more and 95% by mass or less with respect to 100% by mass of the metal-containing paste.

(Binder Resin)

The binder resin mixed with the metal-containing paste is not particularly limited as long as the binder resin is a resin material which is decomposed by sintering. Examples thereof include cellulose resins such as methyl cellulose, ethyl cellulose and carboxymethyl cellulose, acrylic resin, butyral resin, alkyd resin, epoxy resin, phenol resin, and the like. The cellulose resins which tend to easily disappear from the paste by reacting with oxygen or carbon monoxide are preferable. Among the cellulose resins, ethyl cellulose is preferable.

The content of the binder resin is not particularly limited. For example, the content of the binder resin is preferably 0.1% by mass or more and 5% by mass or less with respect to 100% by mass of the metal-containing paste. When the binder resin is left in the sintered body, the electrical resistivity is increased. When sintering is performed in air, the binder resin reacts with oxygen in air to burn, and thus the amount of binder resin left in the sintered body is reduced, with the result that it is possible to reduce the electrical resistivity of the sintered body. Hence, the content of the binder resin is preferably 5% by mass or less. When the content of the binder resin is 5% by mass or less, the amount of the remaining binder resin in the sintered body is reduced, leading to the result that it is possible to ignore the influence of the remaining binder resin on the electrical resistivity of the sintered body. On the other hand, the content of the binder resin in the metal-containing paste is 0.1% by mass or more, and thus the viscosity of the metal-containing paste is increased, with the result that the applicability or printability of the paste can be enhanced, Therefore, the content of the binder resin is preferably 0.1% by mass or more.

(Solvent)

The solvent contained in the metal-containing paste is not particularly limited as long as the solvent has a proper boiling point, a proper vapor pressure, and a proper viscosity. Examples thereof include hydrocarbon solvents, chlorinated hydrocarbon solvents, cyclic ether solvents, amide solvents, sulfoxide solvents, ketone solvents, alcohol compounds, ester solvents for polyhydric alcohol, ether solvents for polyhydric alcohol, terpene solvents, and mixtures thereof. Among them, texanol, butyl carbitol, butyl carbitol acetate, terpineol, and the like which have boiling points of about 200° C. are preferable.

The content of the solvent contained in the metal-containing paste is not particularly limited. For example, the content of the solvent is preferably 2% by mass or more and 25% by mass or less with respect to 100% by mass of the metal-containing paste. The content of the solvent is 25% by mass or less, and thus the viscosity of the metal-containing paste is reduced, with the result that it is possible to reduce an increase in the size of a desired printed shape. On the other hand, the content of the solvent is 2% by mass or more, and thus it is possible to enhance the printability of the metal-containing paste.

An "organic vehicle" in the present embodiment refers to a liquid in which all the binder resin, the solvent and an organic matter being added as necessary are mixed together. In general, as the organic vehicle, an organic vehicle prepared by mixing the binder resin and the solvent can be used. Furthermore, metal salt and polyol may be mixed with the organic vehicle.

A method for manufacturing the metal-containing paste is not particularly limited. For example, it is possible to manufacture the metal-containing paste by mixing the binder resin and the solvent, further adding the metal particles and kneading the mixture with a device such as a planetary mixer. It is possible to use a three-roll mill to enhance the dispersion of the metal particles as necessary.

The metal-containing paste is applied or printed on the sintering member to form the wiring, the electrodes and the like having desired shapes. Specific examples of a coating or printing method include screen printing, dispenser printing, gravure printing, offset printing, inkjet printing, and the like.

(Sintering)

After the metal-containing paste is applied or printed on the sintering member, the sintering member is heated at a temperature of 600° C. or more and 800° C. or less, and thus the sintered body is obtained.

Sintering may be performed in one stage under a nitrogen atmosphere or a reducing atmosphere or heating may be performed in two stages, that is, heating may be performed under an oxidizing atmosphere and thereafter under a reducing atmosphere. When heating is performed in two stages, both heating temperatures in two stages are assumed to be 600° C. or more and 800° C. or less.

The gas atmosphere when heating is performed in two stages will be described below.

As an oxidizing gas in the oxidizing atmosphere, for example, oxygen, air or the like can be used. A gas other than the oxidizing gas and the oxidizing gas can be mixed to be used. As the gas other than the oxidizing gas, an inert gas (such as nitrogen gas or argon gas) can be used.

The concentration of oxygen in the oxidizing atmosphere is not particularly limited. The concentration of oxygen is preferably 50 Pa or more, and further preferably 60 Pa or more or 70 Pa or more in terms of oxygen partial pressure. When the pressure of the atmosphere is the atmospheric pressure (105 Pa), and the oxygen partial pressure thereof is converted to a concentration by volume, the concentration of oxygen is preferably 500 ppm or more, and further preferably 600 ppm or more or 700 ppm or more.

The concentration of oxygen is 500 ppm or more, and thus the binder resin in the metal-containing paste can be sufficiently burned to be removed. On the other hand, when the concentration of the oxidizing gas exceeds 8000 ppm, a reaction may rapidly occur only in the vicinity of the surface of the metal-containing paste. In order to sufficiently burn up to the interior of the sintered body, the concentration of the oxidizing gas is preferably 8000 ppm or less.

As the reducing gas, hydrogen, carbon monoxide, formic acid, ammonia, or the like can be used. As a gas other than the reducing gas, an inert gas such as nitrogen gas or argon gas can be used.

The concentration of the reducing gas is not particularly limited. When the pressure in the reducing atmosphere is the atmospheric pressure (105 Pa), the concentration of the reducing gas is preferably 0.5% or more by volume, and further preferably 1% or more or 2% or more by volume. When the concentration of the reducing gas is less than 0.5% by volume, metal oxide of copper, silver, nickel, or the like is not sufficiently reduced in the sintered body, and thus the metal oxide is left, with the result that the metal wiring after being sintered may exhibit high electrical resistivity.

When a paste including metal particles is used, sintering may be performed under a nitrogen atmosphere. When a paste including metal oxide particles is used, sintering may be performed under a reducing atmosphere. In either case, the sintering temperature is preferably 600° C. or more and 800° C. or less.

[Application Step]

Figure 2C:
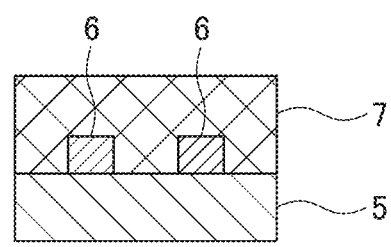

The application step in the present embodiment is shown in FIG. 2C. The application step is a step of applying, on the sintering member 5, a solution 7 including the resin component to the surface of the sintered body 6 and around the sintered body 6.

As the resin component in the application step of the present embodiment, a precursor substance of a resin or a polymerizable monomer of a resin can be used. A resin which is cured by dry treatment for removing the solvent or further treatment or a precursor substance thereof can be used.

The polymerizable monomer is not particularly limited as long as the polymerizable monomer is a monomer of a resin which is cured by polymerization or further treatment. Examples thereof include monomers of flexible resins such as polyimide, liquid crystal polymer, fluororesin, polyethylene terephthalate, and polyethylene naphthalate.

The "precursor substance" of the resin refers to a substance which is cured by any treatment to provide a flexible resin. As the precursor substance, for example, polyamic acid when polyimide is used as the resin is mentioned. The polyamic acid is a substance which is subjected to imidization treatment to change into polyimide and is said to be a precursor substance of polyimide. The precursor substance in the present embodiment also includes a monomer which is cured by any treatment after polymerization.

The solvent is not particularly limited. With consideration given to the solubility of the resin component, a viscosity corresponding to the application method and the like, the solvent can be selected as necessary. For example, when polyimide resin is used, N-methylpyrrolidone can be used as the solvent.

The viscosity of the solution including the resin component is not particularly limited. For example, the viscosity of the solution is preferably 0.5 Pa·s or more and more preferably 2 Pa·s or more. On the other hand, the viscosity of the solution is preferably 50 Pa·s or less and more preferably 25 Pa·s or less. The viscosity of the solution is 0.5 Pa·s or more and 50 Pa·s or less, and thus parts of the resin board can enter the voids of the sintered body. Furthermore, the viscosity of the solution is 2 Pa·s or more and 25 Pa·s or less, and thus the parts of the resin board entering the voids of the sintered body are connected to each other, with the result that it is possible to obtain high adhesion strength and high elongation to failure.

The application method is not particularly limited. For example, a slit coater, a bar coater, a spin coater, or the like can be used.

As described above, the solution including the resin component is applied on the sintering member and is thereafter dried. The drying method is not particularly limited, and for example, the solution may be dried at room temperature under the atmospheric pressure or at least either of heating and decompression may be performed.

The thickness of the resin component-containing layer after being dried is substantially equal to that of the resin board. The thickness of the resin component-containing layer after being dried is not particularly limited. For example, the thickness of the resin component-containing layer after being dried is preferably 5 μm or more, and further preferably 10 μm or more or 15 μm or more. On the other hand, the thickness of the resin component-containing layer after being dried is preferably 100 μm or less, and further preferably 75 μm or less or 50 μm or less. The thickness of the resin component-containing layer after being dried is 5 μm or more, and thus it is possible to prevent the board from being broken by bending or tensile deformation. On the other hand, the thickness of the resin component-containing layer after being dried is preferably 100 μm or less, and thus it is possible to provide excellent flexibility.

[Curing Step]

Figure 2D:
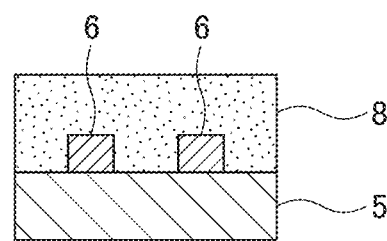

The curing step in the present embodiment is shown in FIG. 2D. The curing step is a step of changing the resin component such as the precursor substance or the polymerizable monomer applied or printed and included in a resin component-containing solution into a resin and forming a resin board layer 8 in a state where the resin is cured.

The curing method is not particularly limited, and heating is preferably performed according to the chemical species of the monomer or various types of catalysts are preferably used. For example, when polyamic acid is used as the precursor substance and polyimide is used as the resin, the curing may be performed through a dehydration reaction using heating.

In the method for manufacturing the wiring board according to the present embodiment, in the curing step, the resin of the resin board passes through the voids connected within the sintered body and spreads by wetting to the interface between the sintered body and the sintering member. Consequently, the resin surface layer is formed on the surface of the sintered body located on the side opposite to the boundary interface in contact with the resin board.

[Separation Step]

Figure 2E:
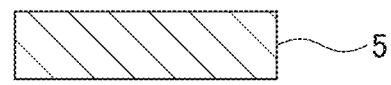

The separation step in the present embodiment is shown in FIG. 2E. The separation step is a step of separating the sintered body 6 and the resin layer 8 from the sintering member 5. For example, an end of the resin layer 8 is gripped and pulled toward the direction of the separation, and thus the sintered body 6 and the resin layer 8 can be separated from the sintering member 5.

EXAMPLES

The present invention will be further described below using Examples. The present invention is not limited to Examples described below.

Examples 1 to 4, Comparative Examples 1 and 2

(Preparation of Samples)

As a sintering member, a magnesia board was used. A copper paste was printed on the surface of the sintering member by a screen printing method. As the copper paste, a copper paste was used which contained 80% by mass of spherical particles having an average particle diameter of 1 µm and 20% by mass of a vehicle formed of a mixture of a binder resin and a solvent. The printed copper paste was dried in air at 100° C., was thereafter subjected to heat treatment in a nitrogen atmosphere to be sintered and was then cooled to room temperature. As shown in Table 1, the heat treatment was individually performed at heat treatment temperatures of 600° C. to 850° C. for heat treatment times of 30 to 60 minutes, and thus sintered bodies having different porosities in Examples 1 to 4 and Comparative Examples 1 and 2 were obtained. As approximate dimensions of copper wiring in the sintered bodies obtained, the line width was 200 µm, the height was 13 µm and the length was 6 cm.

In each of the samples of Examples 1 to 4 and Comparative Examples 1 and 2, on the surface of the sintering member including the sintered body (copper wiring), polyimide varnish ("Yupia" product made by UBE Corporation) in which the amount of solvent was adjusted to provide a viscosity of 10 Pa·s was applied. Then, heat treatment was performed in a nitrogen atmosphere at 280° C. for 10 minutes, thereafter, heat treatment was performed at 350° C. for 30 minutes, and thus the polyimide varnish was cured, with the result that a film-shaped polyimide resin board was formed. The thickness of the resin board was 25 µm in the center part in contact with the sintered body and was 31 µm in the edges. After the resin board was cooled to room temperature, the multilayer of the copper sintered body and the polyimide resin board was separated from the sintering member. Thereafter, the multilayer obtained was subjected to ion beam processing using a cross section polisher (IB-19530CP made by JEOL Ltd.) for obtaining a flat cross section.

(Cross-Section Observation)

Figure 3A:
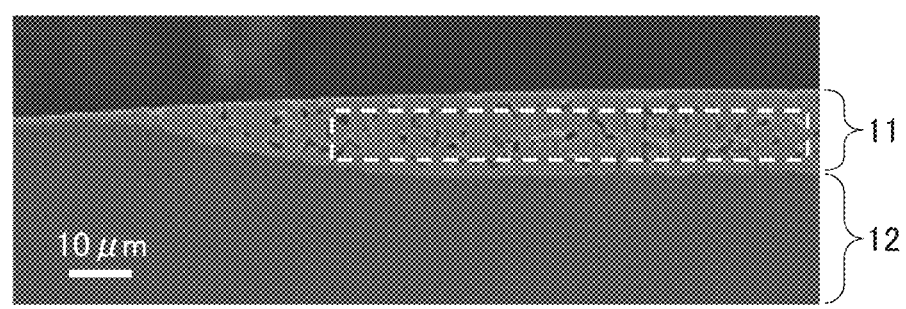
FIG. 3A is a diagram showing a scanning electron micrograph of a cross section of a resin board and a sintered body in the sample of Example 2.
Figure 3B:
FIG. 3B is an enlarged view of the cross-sectional structure of the sintered body in FIG. 3A.
Figure 3C:
FIG. 3C is a diagram showing a structure obtained by performing binarization processing on FIG. 3B.

The size of the obtained multilayer of the copper sintered body and the polyimide resin board was about 20 mm×about 15 mm. In a longitudinal direction in which the copper wiring was formed, the multilayer was vertically cut around its center, and thus a sample for cross-section observation was obtained. A field emission scanning electron microscope (hereinafter abbreviated as "SEM") was used to observe the cross-sectional structure of the multilayer. The cross-sectional structure obtained by observing the sample of Example 2 is shown in FIG. 3A. The upper side of the copper sintered body 11 was a part which had been in contact with the sintering member. It was confirmed that the entire copper sintered body was embedded in the resin board 12. In FIG. 3A, an image portion including only a copper wiring region surrounded by a frame indicated by dotted lines was cut out (FIG. 3B). Then, binarization procedure was performed using image analysis software (Image J), and thus a monochrome image as shown in FIG. 3C was obtained. The area ratio of black portions in FIG. 3C was calculated by Image J, and a porosity (%) was determined.

In the calculation of the porosity, 10 parts of the cross-sectional structure of the sample were arbitrarily selected, the porosities thereof were determined and the average value thereof was used as the porosity of the sintered body in the present example.

Figure 4:
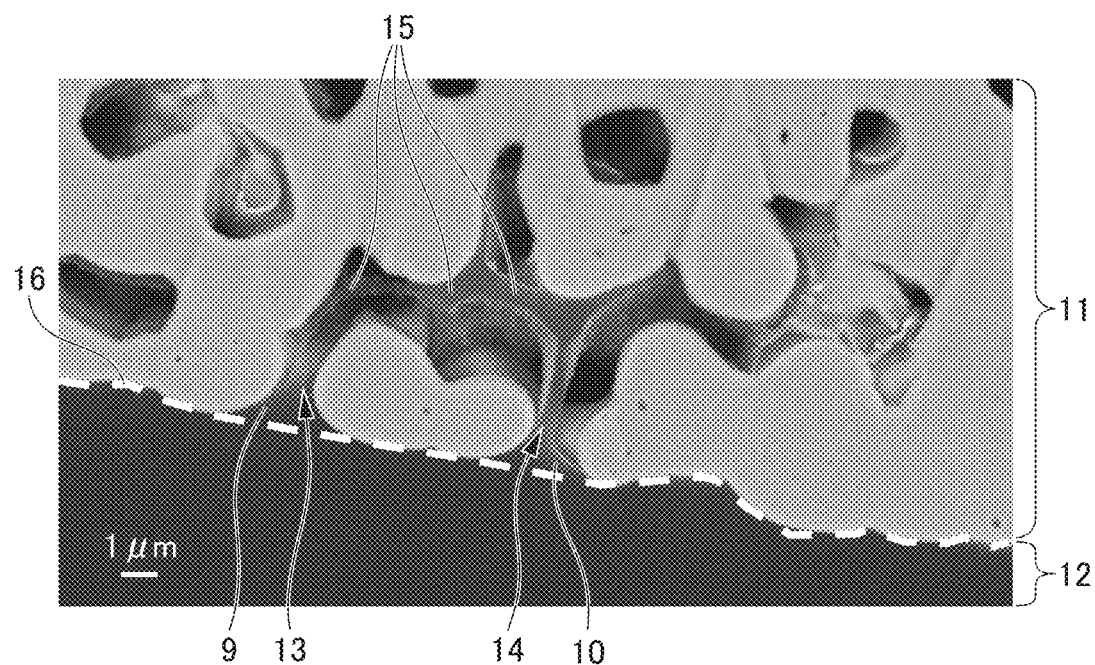
FIG. 4 is a diagram showing a cross section in the vicinity of a boundary between the resin board and the sintered body in the sample of Example 2.

FIG. 4 is a diagram showing an enlarged portion in the vicinity of a boundary interface between the sintered body 11 and the resin board 12 of FIG. 3A. A dotted line displayed in the boundary interface 16 of FIG. 4 is drawn along the outer edge of the cross section of the copper sintered body and shows the boundary between the copper sintered body and the resin board. A region which is located inside of the boundary line and in which the copper sintered portion is not present corresponds to the voids of the copper sintered body. When this SEM image was visually observed and the resin was present inside of the boundary interface 16, it was determined that the resin had entered the voids. For example, within the voids 13 and 14 present around the boundary interface 16 of FIG. 4, opening portions 9 and 10 extending toward the resin board 12 were provided, and parts of the resin of the resin board entered the voids 13 and 14. Furthermore, the voids 13 and 14 were coupled to each other within the copper sintered body, and the parts of the resin 15 entering the voids were also connected to each other.

In the present specification, the wiring board is referred to as having the "entry of resin", in a case where parts of the resin of the resin board enter the voids of the copper sintered body. The wiring board is referred to as having the "resin continuity", in a case where parts of the resin entering a plurality of voids in the sintered body are connected to each other.

(Measurement of Electrical Resistivity)

The electrical resistivity of the sample of Example 2 was measured by a DC four-probe method with a probe interval of 1 mm.

(Evaluation of Adhesion)

A sample for evaluating adhesion was produced. A copper paste was applied to a 10 mm square region on a magnesia board and was thereafter sintered, and thus a copper sintered body in the shape of a flat plate was obtained. Thereafter, polyimide varnish having a viscosity of 15 Pa·s was applied, heat treatment was performed, and the copper sintered body was cooled to room temperature and was then separated from the sintering member. By using the sample where the resulting copper sintered body and the resin board are stacked, a tape test was performed according to ASTM D 3359-79, the area of a separation portion of the copper sintered body separated from the resin board was measured to determine an area ratio (%) and adhesion between the copper sintered body and the resin board was evaluated. The adhesion was evaluated on a 6-point scale from 0 to 5 according to the area ratio (%) of the separation portion as shown below.

5 represents the highest adhesion strength, and 0 represents the lowest adhesion strength.

5: 0%
4: more than 0% and less than 5%
3: equal to or more than 5% and less than 15%
2: equal to or more than 15% and less than 35%
1: equal to or more than 35% and less than 65%
0: equal to or more than 65%

(Measurement of Elongation to Failure)

A tensile test was performed in the longitudinal direction of the copper sintered body, and a change in electrical resistance caused by an increase in elongation strain was measured. Consequently, when the elongation strain was 18%, the electrical resistance was increased by 40% with respect to the initial value. When the elongation strain was further increased, the electrical resistance was rapidly increased, and it was confirmed that the copper sintered body was broken. In the present example, the elongation strain (%) when it was observed that the electrical resistance was rapidly increased was assumed to be "elongation to failure".

The results of the evaluations described above are shown in Table 1. The desirable results are that the electrical resistivity is 4 µΩ·cm or less, the adhesion rating is 3 or more, and the elongation to failure is 8% or more. The further desirable results are that the electrical resistivity is 3 µΩ·cm or less, the adhesion rating is 5, and the elongation to failure is 13% or more.

contact with the resin board. On the surface of the sintered body, a resin surface layer 17 was formed, and the thickness of the resin surface layer 17 was about 0.8 µm. These samples were subjected to heating treatment in air at 200° C., 250° C., and 300° C. for 10 minutes and were cooled, and thereafter, the surface of the copper sintered body was visually observed. Discoloration was not observed on the surface of the copper sintered body before and after the heating treatment, and oxidization on the surface was suppressed. It was confirmed that in this respect, the wiring

TABLE 1

|  | Heat treatment temperature [° C.] | Heat treatment time [min] | Porosity [%] | Entry of resin | Resin continuity | Electrical resistivity [µΩ · cm] | Adhesion rating | Elongation to failure [%] |
| --- | --- | --- | --- | --- | --- | --- | --- | --- |
| Example 1 | 850 | 30 | 3 | Yes | No | 1.9 | 3 | 12 |
| Example 2 | 800 | 30 | 12 | Yes | Yes | 2.2 | 5 | 18 |
| Example 3 | 700 | 30 | 24 | Yes | Yes | 2.9 | 5 | 15 |
| Example 4 | 650 | 30 | 28 | Yes | Yes | 3.4 | 4 | 10 |
| Comparative Example 1 | 850 | 60 | 1 | No | No | 1.8 | 2 | 5 |
| Comparative Example 2 | 600 | 30 | 33 | Yes | Yes | 4 | 3 | 4 |

Examples 5 to 8, Comparative Examples 3 and 4

In Examples 5 to 8 and Comparative Examples 3 and 4, samples were produced under the same conditions as in Example 2 except that sintering was performed at 650° C. for 30 minutes to obtain a copper sintered body having a porosity of 28% and the viscosity of polyimide varnish was changed from 0.6 to 63 Pa·s. The viscosity of polyimide varnish was changed by adjusting the content (indicated by percent by mass with respect to varnish) of N-methylpyrrolidone (NMP) included in the varnish. For the resulting samples, the entry of resin into the voids, the resin continuity within the voids, the adhesion and the elongation to failure were evaluated. The results thereof are shown in Table 2. The desirable results are that the adhesion rating is 3 or more and the elongation to failure is 8% or more. The further desirable results are that the adhesion rating is 5 and the elongation to failure is 13% or more.

board according to the present invention had satisfactory durability against the usage environment.

In the copper sintered body of Example 9, a plurality of voids was distributed with substantially the same porosity as in Example 2. Hence, it is estimated that when polyimide varnish was heated to be cured, the resin of the resin board became wet and spread to the interface between the sintered body and the sintering member through the voids connected within the copper sintered body and thus the resin surface layer of the sintered body was formed.

Comparative Example 5

By the same method as in Comparative Example 1, a plurality of samples of the copper sintered body was produced, and the cross-sectional structure around the surface of the copper sintered bodies were observed with the SEM by the same procedure as in Example 9, heating treatment

TABLE 2

|  | NMP concentration [mass %] | Viscosity [Pa · s] | Entry of resin | Resin continuity | Adhesion rating | Elongation to failure [%] |
| --- | --- | --- | --- | --- | --- | --- |
| Example 5 | 80 | 0.6 | Yes | No | 3 | 11 |
| Example 6 | 75 | 3 | Yes | Yes | 5 | 16 |
| Example 7 | 67 | 24 | Yes | Yes | 5 | 14 |
| Example 8 | 50 | 47 | Yes | No | 3 | 12 |
| Comparative Example 3 | 85 | 0.3 | No | No | 2 | 7 |
| Comparative Example 4 | 40 | 63 | No | No | 2 | 6 |

Evaluation of Durability

Example 9

Figure 5:
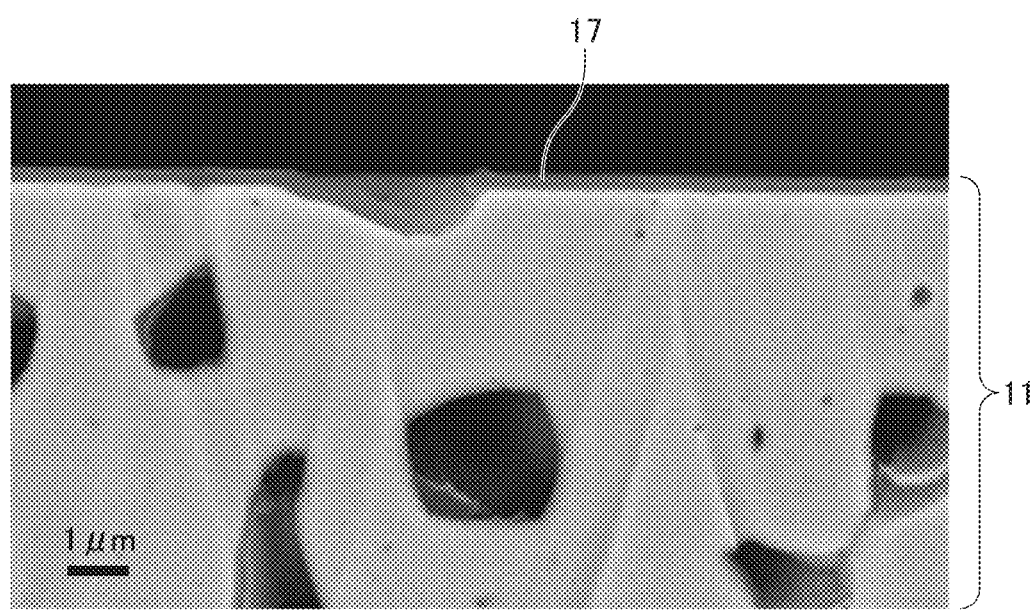
FIG. 5 is a diagram showing the resin surface layer of the sintered body in the sample of Example 2.

By the same method as in Example 2, a plurality of samples of the copper sintered body was produced, and the cross-sectional structure of the copper sintered body was observed with the SEM. FIG. 5 is a diagram showing an enlarged portion around the surface of the sintered body 11 located on the side opposite to the boundary interface 16 in was further performed, and the surface of the copper sintered bodies were visually observed. Consequently, a resin surface layer was not observed on the surface of the copper sintered bodies. Furthermore, in the copper sintered bodies on which heating treatment had been performed at each of temperatures of 200° C., 250° C., and 300° C., the surfaces thereof were all turned blackish gray and were oxidized.

In the copper sintered body of Comparative Example 5, sintering treatment proceeded as compared with Example 9, and thus the distribution ratio of the voids was as low as in Comparative Example 1. Hence, it is estimated that in the copper sintered body, the voids which were so connected as to allow the passage of the resin of the resin board were not present and thus the resin surface layer was not formed.

EXPLANATION OF REFERENCE NUMERALS

1 Wiring board
2 Resin board
21a, 21b, 21c Part of resin board
3 Sintered body
4, 4a, 4b, 4c, 4d Void
41a, 41b, 41c, 41d Opening portion
5 Sintering member
6 Sintered body
7 Solution
8 Resin board layer
9, 10 Opening portion
11 Copper sintered body
12 Resin board
13, 14 Void
15 Resin
16 Boundary interface (dotted line)
17 Resin surface layer

The invention claimed is:

1. A wiring board comprising: a resin board and a metal wiring,
the metal wiring including a sintered body of metal particles,
the sintered body including a plurality of voids having opening portions extending toward the resin board,
parts of the resin board entering the voids from the opening portions,
wherein a surface of the sintered body is coated with a resin surface layer, and
the surface is located on a side opposite to a boundary interface in contact with the resin board.

2. The wiring board according to claim 1, wherein the metal particles include one or more types selected from the group consisting of copper, silver, and nickel.

3. The wiring board according to claim 1, having a void proportion of 1% by volume or more and 30% by volume or less.

4. The wiring board according to claim 1, wherein parts of the voids are connected to each other and parts of the resin board having entered the voids from the opening portions are connected to each other.

5. The wiring board according to claim 1, wherein the sintered body includes, in the voids, an electrically conductive metal element.

6. A method for manufacturing a wiring board including a resin board and a metal wiring containing a sintered body of metal particles, the method comprising:
forming the sintered body on a sintering member;
applying, on the sintering member, a solution including a resin component to a surface of the sintered body and around the sintered body;
curing the resin component to form the resin board; and
separating the sintered body and the resin board from the sintering member,
wherein the sintered body includes a plurality of voids having opening portions extending toward the resin board,
parts of the resin board enters the voids from the opening portions, and
a surface of the sintered body is coated with a resin surface layer, and
the surface is located on a side opposite to a boundary interface in contact with the resin board.

7. The method for manufacturing the wiring board according to claim 6,
wherein the solution includes a precursor substance for the resin or a polymerizable monomer of the resin.

8. A method for manufacturing a wiring board including a resin board and a metal wiring containing a sintered body of metal particles, the method comprising:
providing the resin board; and
forming the sintered body on the resin board,
wherein the sintered body includes a plurality of voids having opening portions extending toward the resin board,
parts of the resin board enters the voids from the opening portions, and
a surface of the sintered body is coated with a resin surface layer, and
the surface is located on a side opposite to a boundary interface in contact with the resin board.

9. The method for manufacturing the wiring board according to claim 8, the method comprising: applying a solution including a resin component on the resin board and curing the resin component to form an interface resin layer, wherein the forming the sintered body includes forming the sintered body on the interface resin layer.

10. The method for manufacturing the wiring board according to claim 9, wherein the solution includes a precursor substance of a resin or a polymerizable monomer of a resin.

* * * * *